(12) United States Patent
Rudra (10) Patent No.: US 8,575,984 B1
(45) Date of Patent: Nov. 5, 2013

(54) MULTISTAGE LATCH-BASED ISOLATION CELL

(75) Inventor: Anjan Rudra, Maharshtra (IN)

(73) Assignee: Applied Micro Circuits Corporation, Sunnyvale, CA (US)

( * ) Notice: Subject to any disclaimer, the term of this patent is extended or adjusted under 35 U.S.C. 154(b) by 146 days.

(21) Appl. No.: 12/945,378

(22) Filed: Nov. 12, 2010

(51) Int. Cl.
*H03K 3/00* (2006.01)

(52) U.S. Cl.
USPC ............ 327/199; 327/200; 327/215; 327/219

(58) Field of Classification Search
USPC .................. 327/199, 200, 202, 215, 217–219
See application file for complete search history.

(56) References Cited

U.S. PATENT DOCUMENTS

| | | | |
|---|---|---|---|
| 5,633,607 A * | 5/1997 | Millar | ........................... 327/217 |
| 2006/0214687 A1 | 9/2006 | Arora et al. | |
| 2008/0005595 A1 | 1/2008 | Spengler et al. | |
| 2009/0079483 A1 * | 3/2009 | Keskin et al. | ................. 327/161 |
| 2010/0019774 A1 | 1/2010 | Wu et al. | |
| 2010/0153759 A1 | 6/2010 | Singhal | |

\* cited by examiner

*Primary Examiner* — Long Nguyen (74) *Attorney, Agent, or Firm* — Turocy & Watson, LLP (57) ABSTRACT

A multistage latch-based isolation cell is provided. The isolation cell includes a latch to receive a first binary signal and an enable signal. The latch initially supplies a second binary signal with an unknown value in response to the enable port receiving an enable signal having a first polarity value, and subsequent to receiving the first binary signal with a first value, supplying the second binary signal with the first value. The isolation cell includes a delay device to receive the enable signal and to supply a delayed enable signal. A reset latch receives the second binary signal, the delayed enable signal, and a reset pulse. The reset latch supplies a third binary signal equal to the first value in response to the reset latch receiving the reset pulse, followed by the delayed enable signal with the first polarity value, followed by the second binary signal.

19 Claims, 8 Drawing Sheets

MULTISTAGE LATCH-BASED ISOLATION CELL

BACKGROUND OF THE INVENTION

1. Field of the Invention

This invention generally relates to isolation circuitry and, more particularly, to a multistage cell that eliminates uncertainty when reestablishing signal flow between isolated modules.

2. Description of the Related Art

Combinational logic devices are designed to obey AND, OR, NOR NAND, NOT, or XOR logic tables. The output of combinational logic isolation cells have no "memory" of any previous input or output values. As seen in the tables below, it is possible to hold a combinational logic output value to a known state by controlling the input values.

Table A is an OR type logic table.

TABLE A

| ISO A | D | Q |
|---|---|---|
| 0 | 0 | 0 |
| 0 | 1 | 1 |
| 1 | 0 | 1 |
| 1 | 1 | 1 |

Table B is an AND type logic table.

TABLE B

| ISO A | D | Q |
|---|---|---|
| 0 | 0 | 0 |
| 0 | 1 | 0 |
| 1 | 0 | 0 |
| 1 | 1 | 1 |

Figure 9:
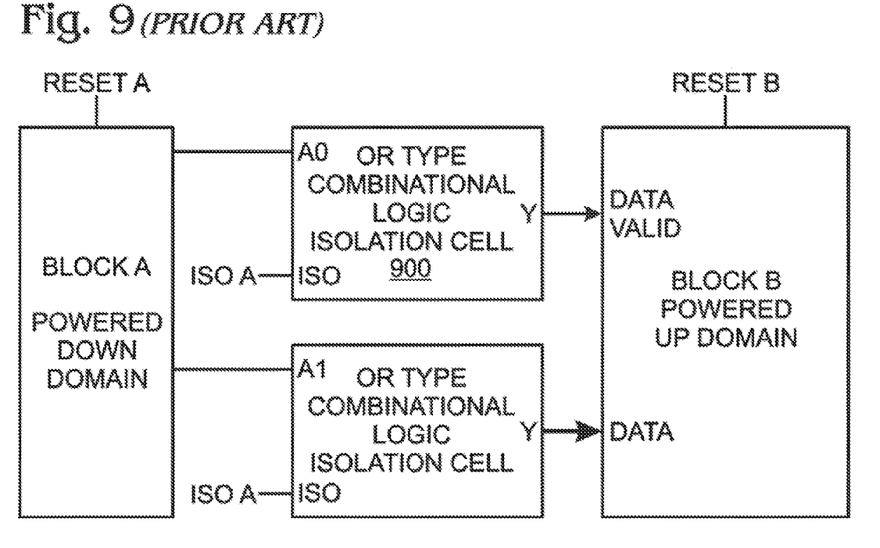
FIG. 9 is a schematic diagram of system using combinational logic isolation cells, presented to illustrate a problem that may occur when one of the modules in the system is powered down (prior art).

FIG. 9 is a schematic diagram of system using combinational logic isolation cells, presented to illustrate a problem that may occur when one of the modules in the system is powered down (prior art).

Figure 10:
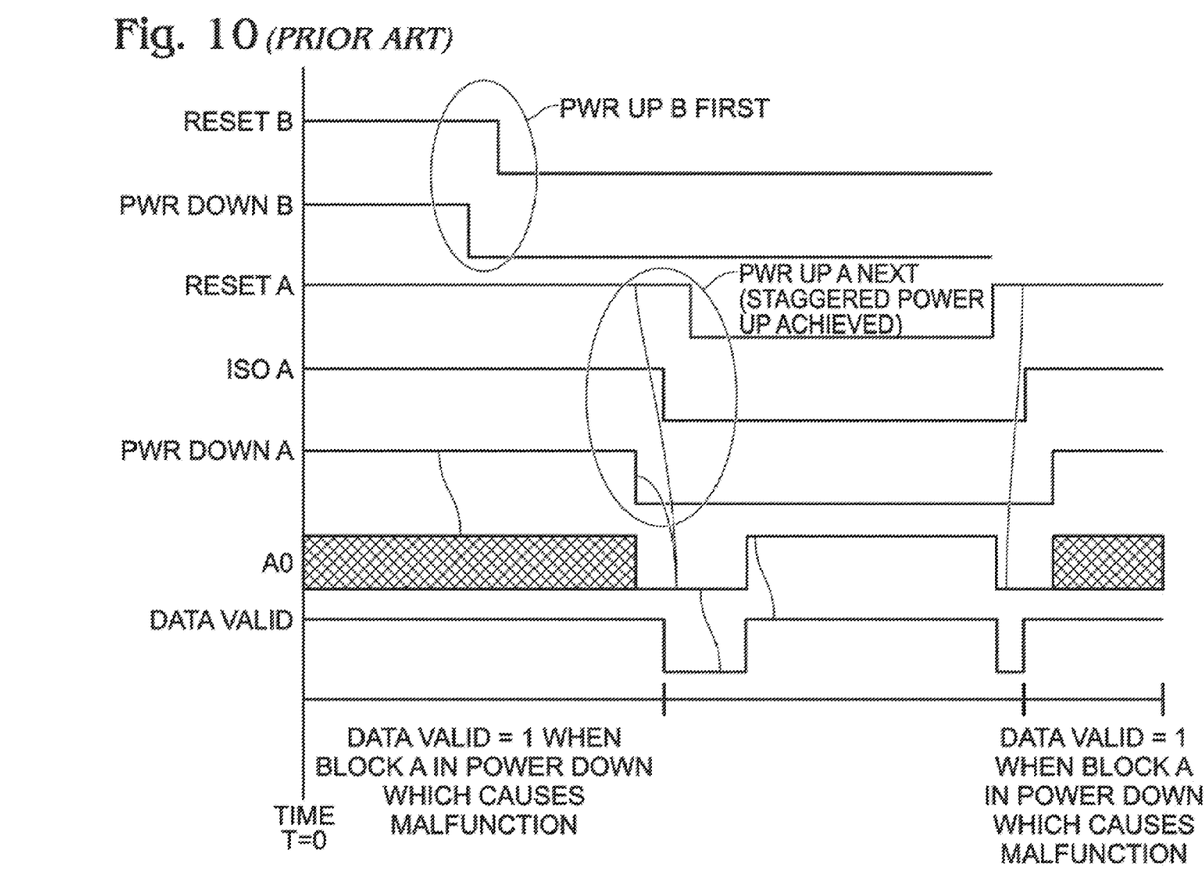
FIG. 10 is a timing diagram associated with the system of FIG. 9.

FIG. 10 is a timing diagram associated with the system of FIG. 9. Here, every time ISO A signal is set (indicating Block A is in Power Down), OR isolation cell 900 sets the "DATA VALID" signal to Block B and hence Block B starts sampling invalid data when Block A is actually in power down.

In contrast, a latch is a device with two possible stable states, making it possible to store a bit of information in "memory". The memory is typically created using one of the above-mentioned combinational logic functions in a feedback configuration. SR latches and JK latches are well known in the art. A gated latch (e.g., a gated SR latch) may incorporate a reset function. A slightly more complicated example of a latch is a flip-flop.

Table C is an exemplary latch logic table.

TABLE C

| ISO A | D | Q[n + 1] |
|---|---|---|
| 1 | 0 | 0 |
| 1 | 1 | 1 |
| 0 | X | Q[n] |

Figure 1:
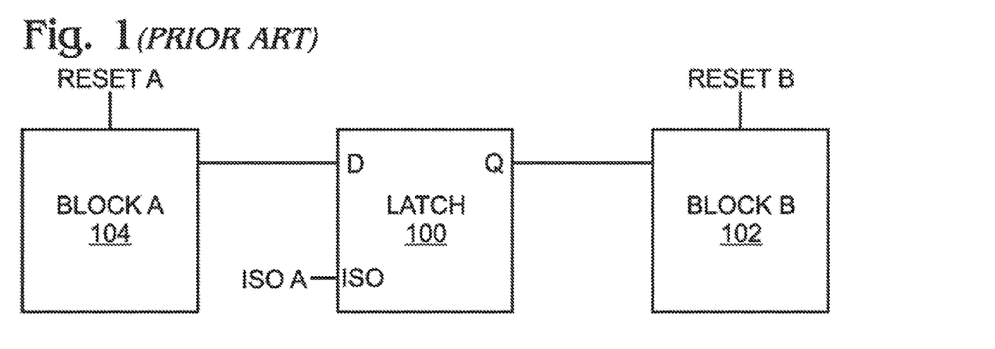
FIG. 1 is a schematic block diagram illustrating a system using a single stage latch as an isolation cell (prior art).

FIG. 1 is a schematic block diagram illustrating a system using a single stage latch as an isolation cell (prior art).

Figure 2:
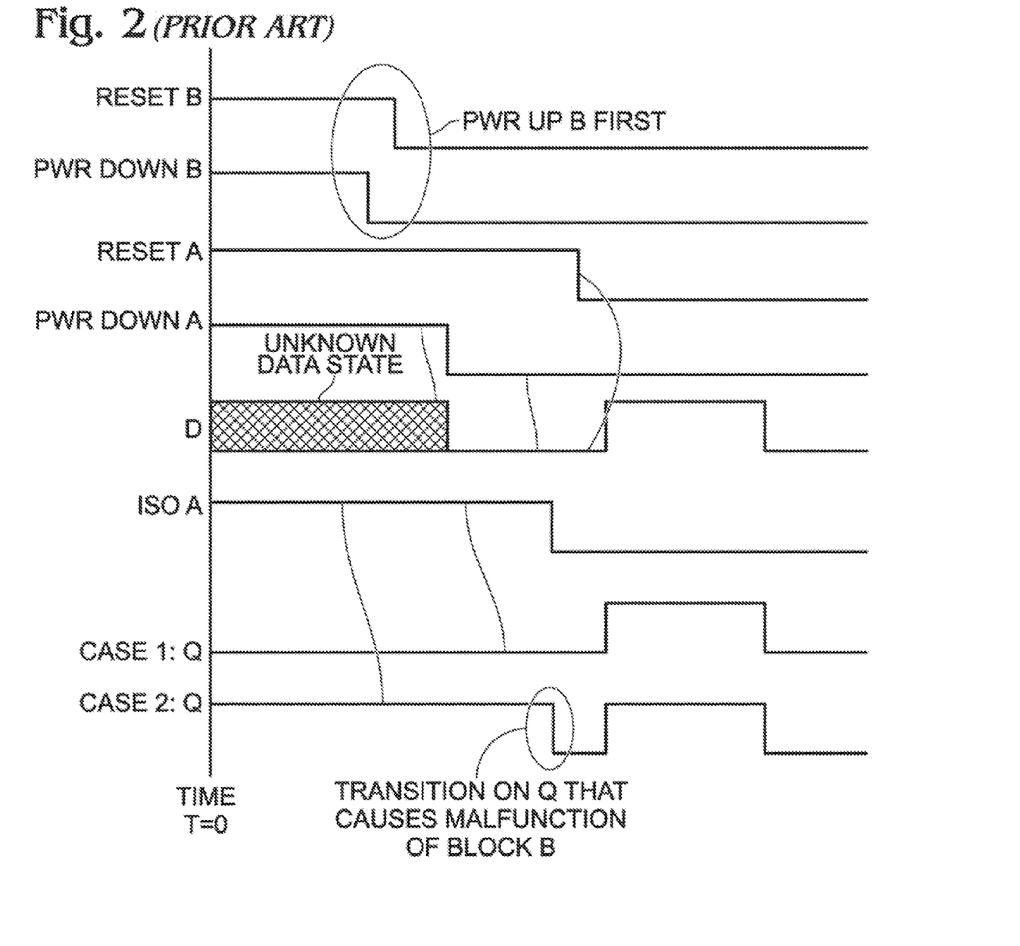
FIG. 2 is a timing diagram associated with the staggered power up of the system of FIG. 1 (prior art).

FIG. 2 is a timing diagram associated with the staggered power up of the system of FIG. 1 (prior art). Considering both FIGS. 1 and 2, a latch 100 may generate an unexpected transition at the output Q as shown in FIG. 2 (Case 2: Q). The uncertainty is because the value of the feedback loop in the latch can't be predicted the first time the ISO A enable port is triggered. That is, the latch input value from the previous enable cycle is unknown. Initially, Block B 102 is powered up (PWR DOWN B goes low), followed by a reset (RESET B). Then, Block A 104 is powered up. Before Block A is reset, the ISO A signal triggers the latch isolation cell 100 to operate so that any signal appearing on the D port input is transferred to the Q port output. After ISO A goes low, Block A receives the RESET A signal. After RESET A, Block A outputs a data signal (D). If Block B is only designed to handle Case 1, where the value of Q matches the value of D, then the Block B may malfunction due to the unexpected transition on Q (Case 2). When designing a staggered power up, where modules are switched on one after the other, a manual verification must therefore be performed to ensure that the signal timings as correct in all conditions. This process is very time consuming and prone to errors.

Upon startup, the latch isolation cell could supply either a "1" or "0" value, and verification is required to determine if Block B 102 can tolerate the uncertainty. If Block 104 had n outputs, with n corresponding latch isolation cells, there would be $2^n$ combinations against which Block 102 would need tolerance verification. For example, Block A may have 8 outputs isolated using 8 latch isolation cells (there rarely ever is just one signal going from Block A to Block B). Since the 8 latch isolation cells output either 1 or 0, there are $2^8=256$ combinations of outputs. Verification must be performed to determine if Block 102 can accept all of the possible combinations without going into a bad state.

It would be advantageous if electronic modules could be isolated with a latch circuit having predictable outputs.

SUMMARY OF THE INVENTION

The output of a single stage latch isolation cell is not entirely predictable when the output is initially unlatched. This unpredictable output may expose a low power Application-Specific Integrated Circuit (ASIC)/System-on-Chip (SoC) design to conditions that it is not designed to handle, and may cause malfunctions. Described herein is a multistage isolation cell whose output is always predictable, by using a latch in conjunction with one or more reset latches. Since the output of the cell is totally predictable, the circuitry is unlikely to malfunction.

Accordingly, a multistage latch-based isolation cell is provided. The isolation cell includes a latch to receive a first binary signal and an enable signal. The latch has an output port to initially supply a second binary signal with an unknown value in response to the enable port receiving an enable signal having a first polarity value. Subsequent to receiving the first binary signal with a first value, the latch supplies the second binary signal with the first value. The isolation cell includes a delay device to receive the enable signal and to supply a delayed enable signal. A reset latch receives the second binary signal, the delayed enable signal, and a reset pulse. The reset latch supplies a third binary signal value equal to the first value in response to the reset latch receiving the reset pulse, followed by the delayed enable signal with the first polarity value, followed by the second binary signal. Alternately stated, the reset latch output port exclusively supplies the same value binary signal as input to the latch input port, following the supply of the enable signal.

Addition details of the above-described isolation cell, an isolation cell method, and a circuit with modules selectively isolated using a multistage latch-based isolation cell, are provided below.

DETAILED DESCRIPTION

Figure 3:
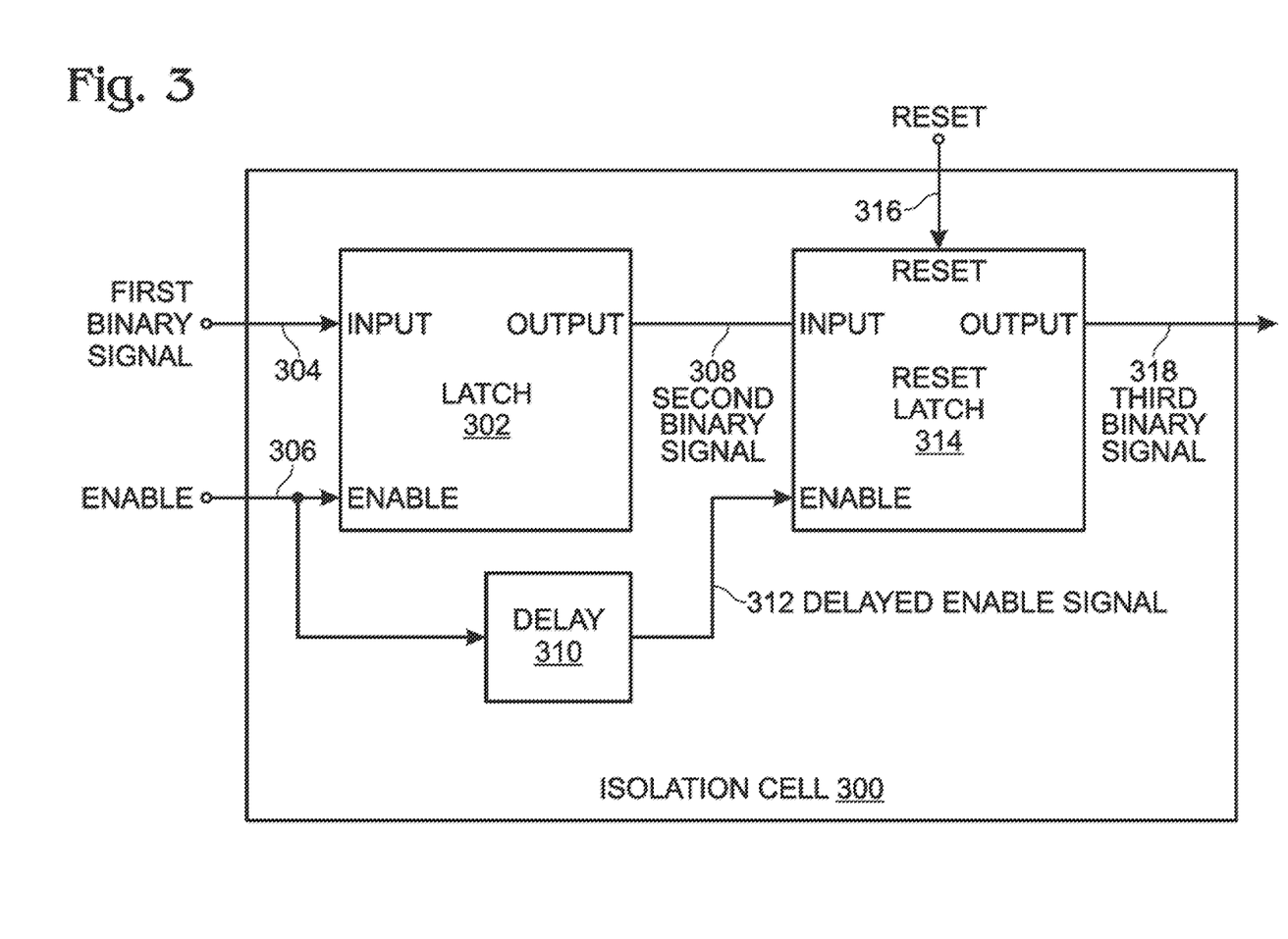
FIG. 3 is a schematic block diagram of a multistage latch-based isolation cell.

FIG. 3 is a schematic block diagram of a multistage latch-based isolation cell. The isolation cell 300 comprises a latch 302 having an input port on line 304 to receive a first binary signal and an enable port on line 306. The latch 302 has an output port on line 308 to supply a second binary signal with value equal to a previous first binary signal value. That is, the second binary signal value is equal to the first binary signal value during a previous enable signal. Initially, the latch 302 supplies a second binary signal with an unknown value in response to the enable port receiving an enable signal having a first polarity value, and subsequent to receiving the first binary signal with a first value, supplies the second binary signal with the first value. The latch 302 can be a SR NAND latch, SR NOR latch, JK latch, gated SR latch, gated D latch, gated T latch, or gated Earle latch to name a few examples.

The isolation cell 300 also comprises a delay device 310 having an input port on line 306 to receive the enable signal and an output port on line 312 to supply a delayed enable signal. A reset latch 314 has an input port on line 308 to receive the second binary signal, an enable port on line 312 to receive the delayed enable signal, a reset port on line 316 to receive a reset pulse. The reset latch 314 has an output port on line 318 to supply a third binary signal with the first value in response to the reset latch receiving the'reset pulse, followed by the delayed enable signal with the first polarity value, followed by the second binary signal. Alternately stated, the reset latch output port on line 318 exclusively supplies the same value binary signal as input to the latch input port on line 304, following by the supply of the enable signal. A variety of latches are known in the art that are enabled with a reset function, such as a gated SR latch, a gated D latch, a gated T latch, and a gated Earle latch.

The latch 302 latches the first binary signal value at the output port on line 308 in response to receiving an enable signal with a second polarity value. The reset latch 314 latches the second binary signal value at the output port on line 318 in response to receiving a delayed enable signal with the second polarity value.

Figure 4:
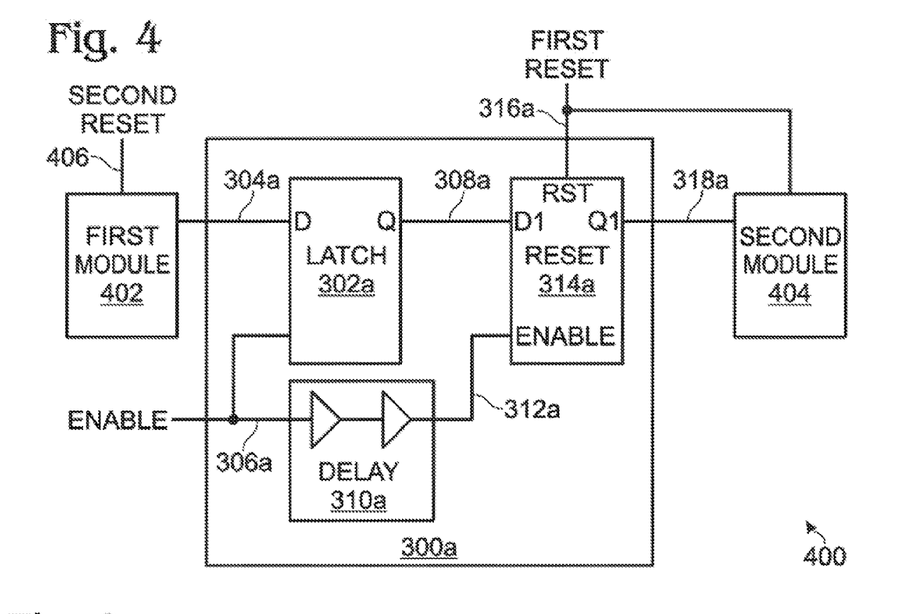
FIG. 4 is a schematic block diagram of a circuit with modules selectively isolated using a multistage latch-based isolation cell.

FIG. 4 is a schematic block diagram of a circuit with modules selectively isolated using a multistage latch-based isolation cell. The circuit 400 comprises a first module 402 having an output port on line 304a to supply a first binary signal. A first multistage logic-based isolation cell 300a is as described above in the explanation of FIG. 3. A latch 302a has an input port (D) on line 304a to receive the first binary signal, an enable port on line 306a, and an output port (Q) on line 308a. As is conventional, the latch 302a has an output port to supply a second binary signal with a value equal to a previous first binary signal value. The output port initially supplies a second binary signal with an unknown value in response to the enable port receiving a first enable signal having a first polarity value, and subsequent to receiving the first binary signal with a first value, supplying the second binary signal with the first value. A delay device 310a, enabled for example as series-connected buffers, has an input port on line 306a to receive the first enable signal and an output port on line 312a to supply a delayed first enable signal. A delay device can also be made using combinational logic.

A reset latch 314a has an input port (D1) on line 308a to receive the second binary signal, an enable port on line 312a to receive the delayed first enable signal, a reset port on line 316a to receive a first reset pulse, and an output port (Q1) on line 318a to supply a third binary signal. The third binary signal has a value equal to the first value in response to the reset latch 314a receiving the delayed first enable signal with the first polarity value, followed by the first reset pulse, followed by the second binary signal. A second module 404 has an input port on line 318a to receive the third binary signal.

In one aspect, the second module 404 is initially powered up and reset. For simplicity, it can be assumed that the second module is powered up and reset in response to the first reset pulse on line 316a. The first module 402 is powered up and reset, subsequent to the second module power up, in response to second reset pulse on line 406. The first module 402 initially supplies the first binary signal with an unknown value, and subsequent to the second reset pulse, supplies the first binary signal with a known value. The latch 302a receives the first enable pulse on line 306a with the first polarity value subsequent to the first module 402 resetting, and the second module 404 receives the third binary signal with the known value.

In one aspect, the latch 302a latches the first binary signal value at the output port on line 308a in response to receiving a first enable signal with a second polarity value. The reset latch 314a latches the second binary signal value at the output port on line 318a in response to receiving a delayed first enable signal with the second polarity value.

In one aspect, the delay device 310a supplies the enable pulse with a delay on line 312a that is greater than or equal to the period of time between the supply of the enable signal on line 306a and the second reset pulse on line 406.

Figure 5:
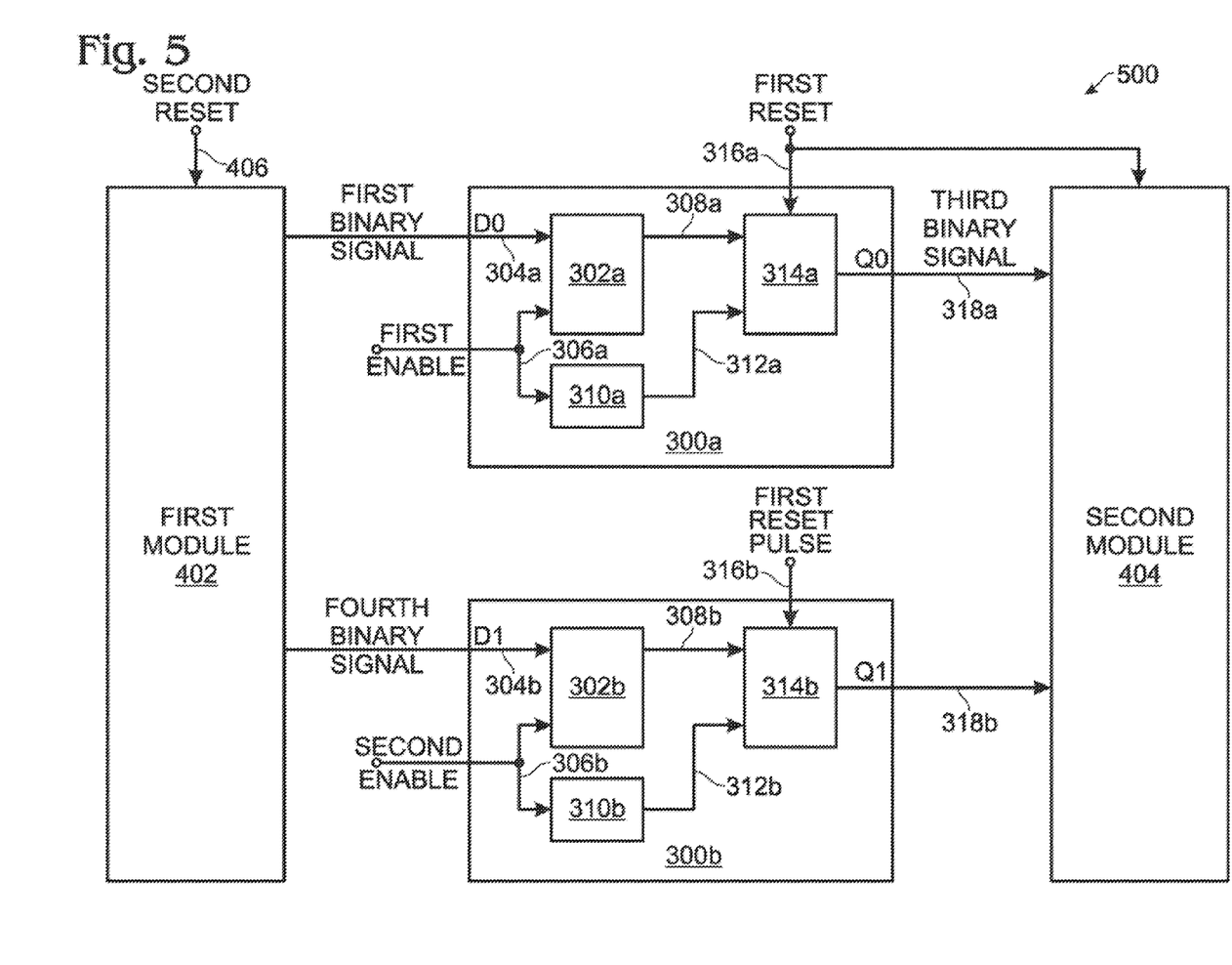
FIG. 5 is a schematic block diagram depicting a variation of the system disclosed in FIG. 4.

FIG. 5 is a schematic block diagram depicting a variation of the system disclosed in FIG. 4. In this aspect, the first module 402 has an output port on line 304b to supply a fourth binary signal. The circuit 500 further comprises a second multistage logic-based isolation cell 300b. The second isolation cell 300b includes a latch 302b having an input port (D1) on line 304b to receive the fourth binary signal, an enable port on line 306b, and an output port on line 308b to supply a fifth binary signal. As is conventional, the fifth binary signal has a value equal to a previous fourth binary signal value. The fifth binary signal initially has an unknown value in response to the enable port receiving a second enable signal having a first polarity value, and subsequent to receiving the fourth binary signal with a first value, supplies the fifth binary signal with the first value. Note: in one aspect, the enable signals on line 306a and 306b are the same signal.

A delay device 310b has an input port to receive the second enable signal on line 306b and an output port on line 312b to supply a delayed second enable signal. A reset latch 314b has an input port on line 308b to receive the fifth binary signal, an enable port to receive the delayed second enable signal on line 308b, a reset port to receive a second reset pulse on line 316a, and an output port (Q1) on line 318b to supply a sixth binary signal. The sixth binary signal has a value equal to the first value in response to the reset latch 314b receiving the first reset pulse, followed by the delayed second enable signal with the first polarity value, followed by the fifth binary signal. The second module 404 has an input port on line 318b to receive the sixth binary signal.

It should be noted that although a single module is shown supplying input signals, in other aspects (not shown) inputs 304a and 304b could be supplied by independent modules. Likewise, although a single module is shown accepting the output signals, in other aspects (not shown) outputs 318a and 318b could be received by independent modules.

Functional Description

Figure 6:
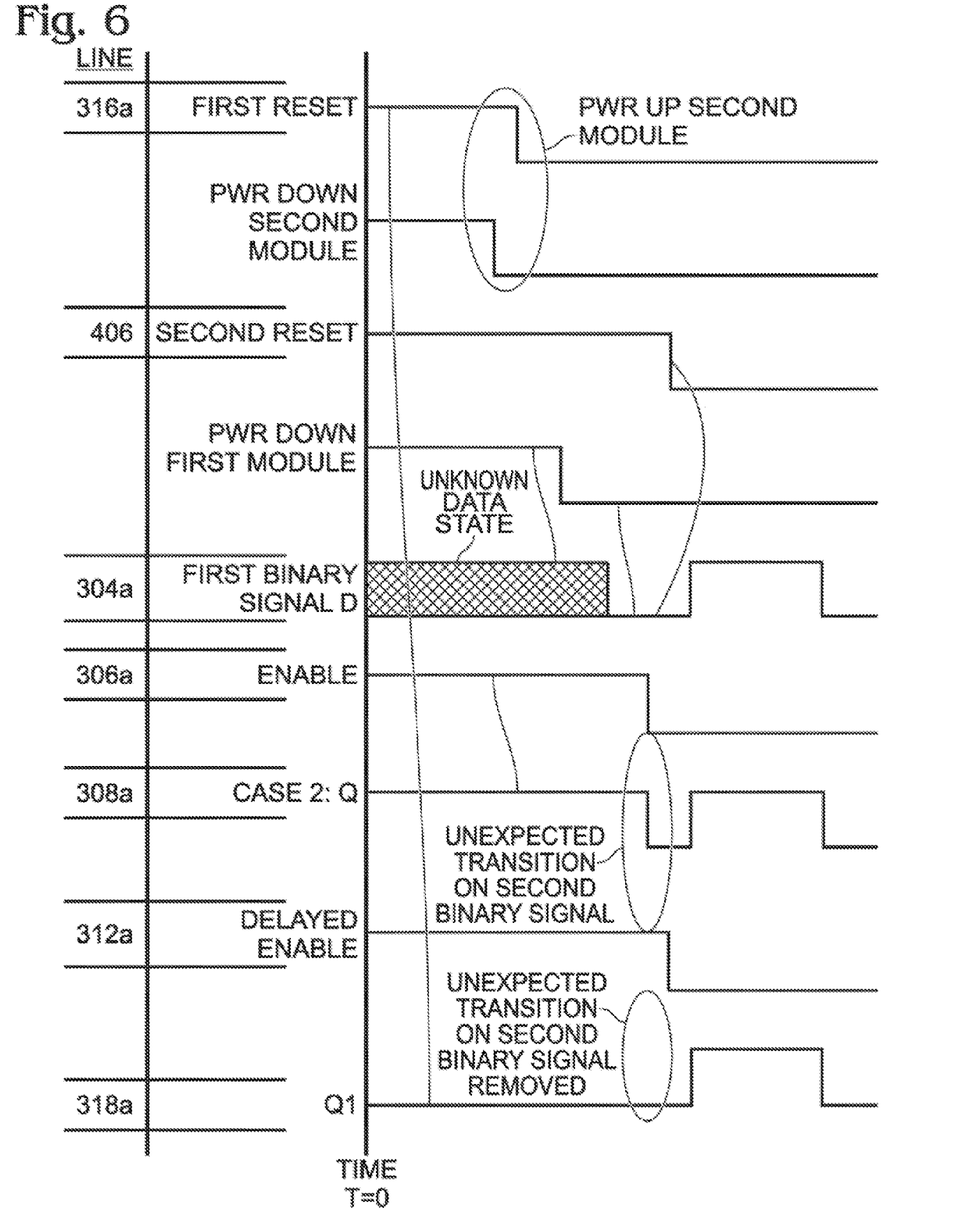
FIG. 6 is a timing diagram associated with the system of FIG. 4.

FIG. 6 is a timing diagram associated with the system of FIG. 4. The timing diagram shows that in Case 2, when an unexpected transition occurs on the second binary signal (line 308a), it is not transferred to Q1 (line 318), making the output of the isolation cell equivalent to Case 1 (see FIG. 2), and preventing the second module from malfunctioning. Note: in this example the modules have separate power up inputs that are triggered before the resets.

The second module is powered up first, and reset. Then, the first module is powered up and supplies a "0" first binary signal value on line 304. The enable signal is supplied before the first module is reset. However, it is possible that the latch will initially pulse low until the first module supplies a valid first binary signal, after the second reset. Even in this condition, the use of the delayed enable pulse and reset latch ensures that the unexpected low pulse on line 308a is not transitioned through to output line 318a.

Figure 7:
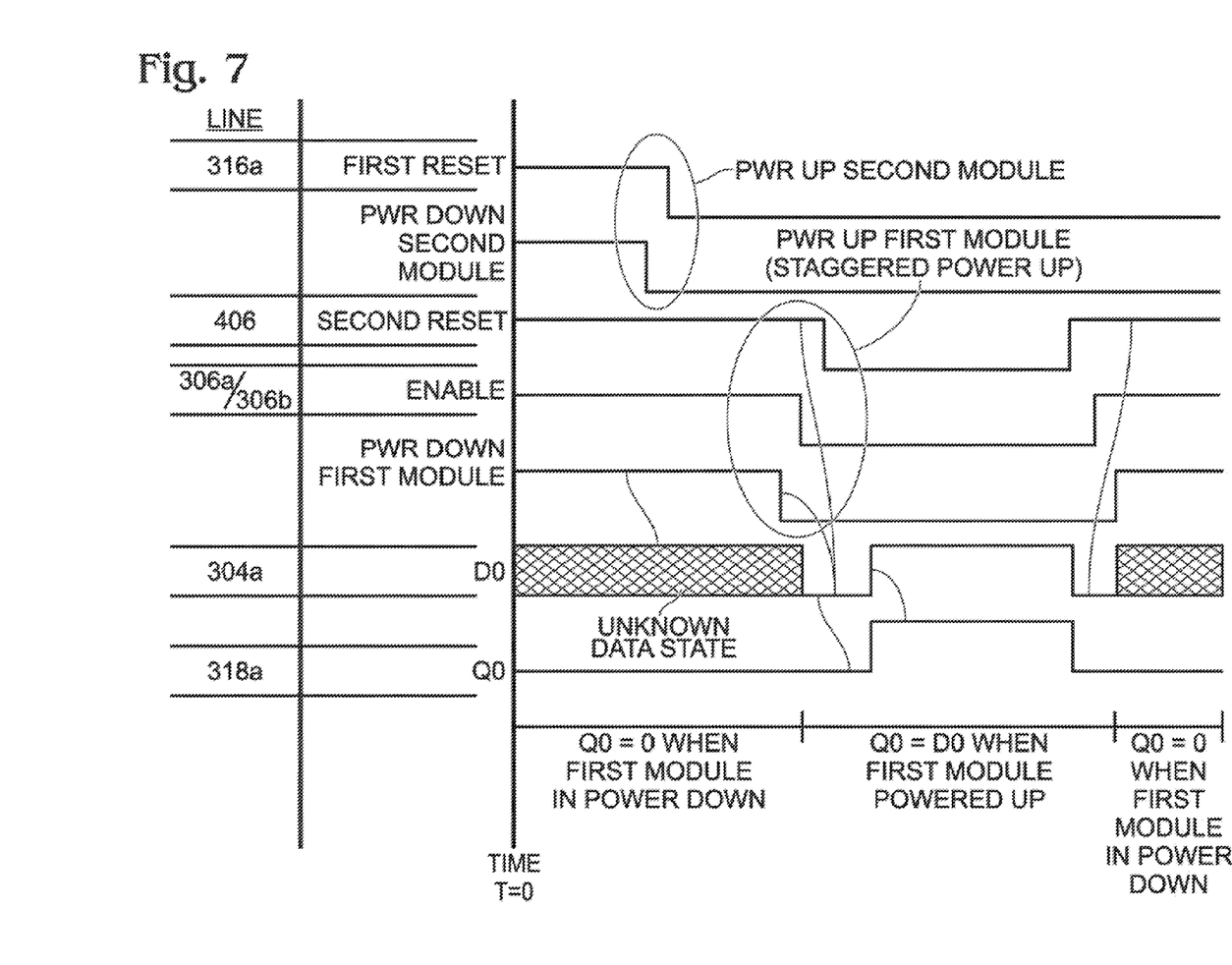
FIG. 7 is a timing diagram associated with the system of FIG. 5.

FIG. 7 is a timing diagram associated with the system of FIG. 5. The second module is powered up and reset first. The first module is powered up next, thereby proving staggered power up. By designing a power controller that follows the flowchart of events in the timing diagram, the third binary signal (Q0) is driven to zero every time the enabled signal is set.

By avoiding the use of simple AND/OR or simple latch-based isolation cells, staggered power ups of the system can be performed, and all isolated signals in the circuit retain their previous state. The use of the circuitry shown in FIGS. 3 through 6 ensures that blocks can be isolated without the need for intensive simulation and verification. Conventional combinational isolation cell require a rigorous verification effort.

Figure 8:
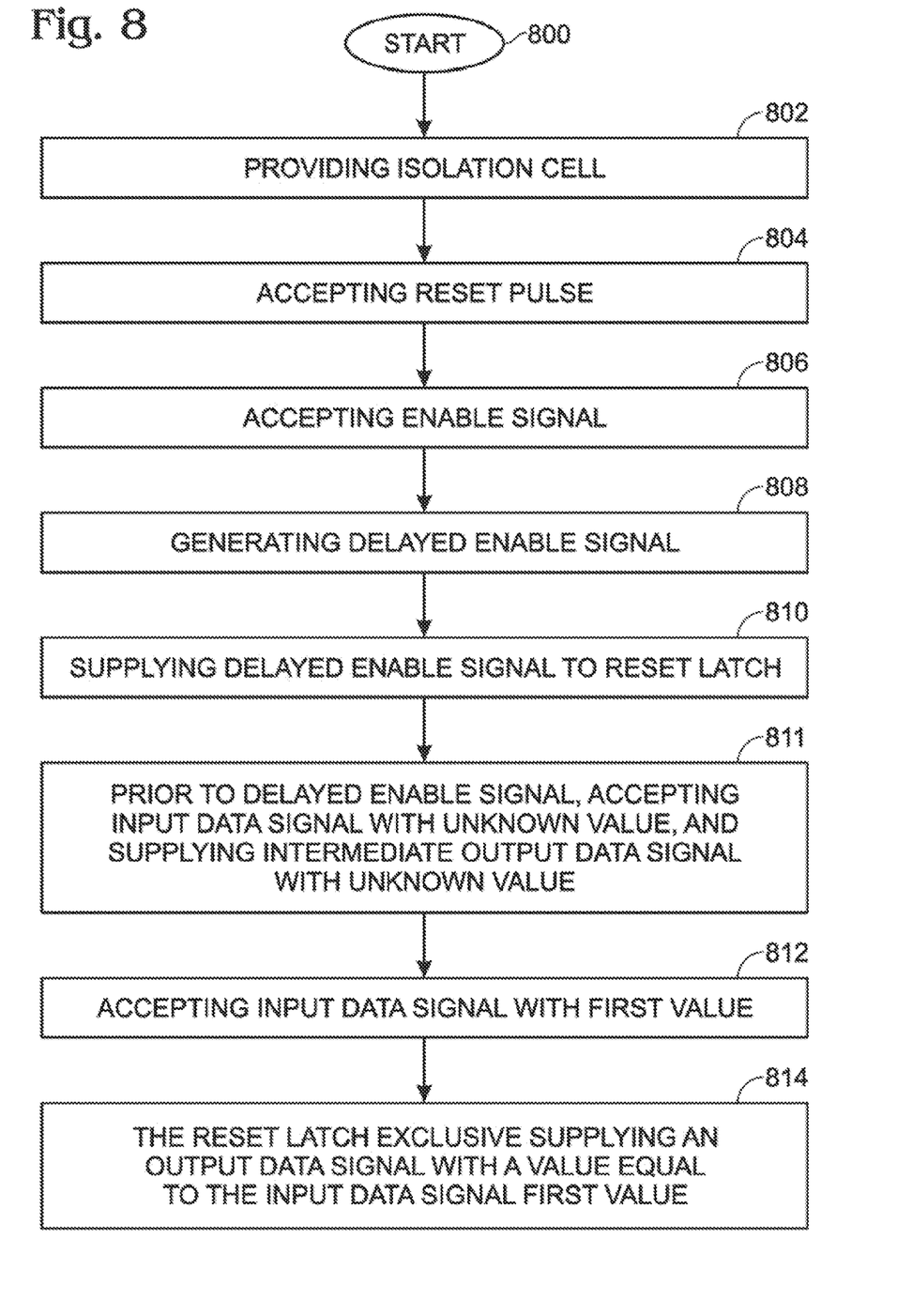
FIG. 8 is a flowchart illustrating a method for isolating circuit modules.

FIG. 8 is a flowchart illustrating a method for isolating circuit modules. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides an isolation cell with a reset latch, a latch having a signal output connected to a signal input of the reset latch, and a delay device. Step 804 accepts a reset pulse at the reset latch. Subsequent to the reset pulse, the latch and the delay device accept an enable signal in Step 806. Subsequent to the enable signal, Step 808 generates a delayed enable signal. Step 810 supplies the delayed enable signal to the reset latch. Prior to the supply of the delayed enable signal, in Step 811 the latch accepts an input data signal with an unknown value and supplies an intermediate output data signal with the unknown value. Subsequent to the delayed enable signal, the latch accepts an input data signal with a first binary value in Step 812, and supplies an intermediate output data signal with the first binary value. In Step 814 the reset latch exclusively supplies an output data signal with the first binary value. Alternately stated, any uncertainties associated with the latch coming out an isolation state, are not transferred to the output data signal.

A system and method have been provided for a multistage isolation cell. Examples of particular processes and hardware units have been presented to illustrate the invention. However, the invention is not limited to merely these examples. Other variations and embodiments of the invention will occur to those skilled in the art.

I claim:

1. A multistage latch-based isolation cell, comprising:
a latch having a first input port configured to receive a first binary signal, a first enable port configured to receive an enable signal, and a first output port configured to supply a second binary signal with a value equal to a previous value of the first binary signal;
a delay device having a second input port configured to receive the enable signal and a second output port configured to supply the enable signal with a delay to yield a delayed enable signal, wherein a value of the delayed enable signal on the second output port becomes equal to a value of the enable signal on the second input port after a delay period of the delay device; and
a reset latch having a third input port configured to receive the second binary signal, a second enable port configured to receive the delayed enable signal, a first reset port configured to receive a reset pulse, and a third output port configured to supply a third binary signal having a value equal to a first value of the first binary signal in response to the reset latch receiving the reset pulse, followed by the delayed enable signal with a first polarity value, followed by the second binary signal.

2. The isolation cell of claim 1, wherein the latch latches a value of the first binary signal at the first output port in response to receiving an enable signal with a second polarity value; and
wherein the reset latch latches a value of the second binary signal at the third output port in response to receiving the delayed enable signal with the second polarity value.

3. The isolation cell of claim 1, wherein the third output port supplies a same value binary signal as input to the first input port following the enable signal.

4. The isolation cell of claim 1, wherein the delay device comprises one or more series-connected buffers.

5. The isolation cell of claim 1, wherein the delay period is greater than or equal to a period of time between receipt of the enable signal at the first enable port and receipt of a reset signal received at a module that supplies the first binary signal to the first input port of the latch.

6. The isolation cell of claim 1, further comprising a receive module having a fourth input port to receive the third binary signal and a second reset port to receive the reset pulse.

7. The isolation cell of claim 1, further comprising a module that provides the first binary signal to the first input port.

8. The isolation cell of claim 1, wherein the first output port initially supplies the second binary signal with an initial value in response to the first enable port receiving the enable signal having the first polarity value, and subsequent to receiving the first binary signal with the first value, supplying the second binary signal with a value equal to the first value.

9. A multistage latch-based isolation cell, comprising:
- a latching means for receiving a first binary signal and supplying a second binary signal with a value equal to a previous value of the first binary signal;
- a delay means for receiving the enable signal and supplying the enable signal with a delayed timing to yield a delayed enable signal, wherein the delayed enable signal becomes equal to the enable signal after a delay period of the delay means has elapsed; and
- a reset latching means for receiving the second binary signal and supplying a third binary signal value equal to a first value of the first binary signal in response to the reset latch receiving a reset pulse, followed by the delayed enable signal with a first polarity value, followed by the second binary signal.

10. A method for isolating circuit modules, comprising:
- receiving a reset pulse at a reset latch of an isolation cell;
- subsequent to the receiving the reset pulse, receiving an enable signal at a latch of the isolation cell and a delay device of the isolation cell, wherein the latch comprises a data signal output connected to a data signal input of a reset latch;
- receiving a first input data signal with an initial value at the latch and supplying, by the latch, a first intermediate output data signal with the initial value;
- subsequent to the receiving the enable signal and the receiving the first input data signal, generating, by the delay device, a delayed enable signal that is a delayed version of the enable signal, wherein the delayed enable signal becomes equal to the enable signal after a delay period of the delay device;
- supplying the delayed enable signal to the reset latch;
- subsequent to the supplying the delayed enable signal, receiving a second input data signal with a first binary value at the latch and supplying, by the latch, a second intermediate output data signal corresponding to the first binary value; and
- supplying, by the reset latch, a third output data signal corresponding to the first binary value.

11. The method of claim 10, wherein the generating the delayed enable signal comprises delaying the enable signal using one or more series-connected buffers.

12. The method of claim 10, wherein the delay period is greater than or equal to a period of time between the receiving the enable signal and delivery of a reset pulse to a module that supplies the input data signal.

13. The method of claim 10, further comprising latching, by the latch, the first binary value in response to receiving a second enable signal with a different polarity value than the enable signal.

14. The method of claim 13, further comprising latching, by the reset latch, the initial value of the intermediate output data signal in response to receiving the delayed enable signal with the different polarity value.

15. The multistage latch-based isolation cell of claim 9, wherein the latching means initially supplies the second binary signal with an initial value in response to receiving the enable signal having the first polarity value, and subsequent to receiving the first binary signal with the first value, supplying the second binary signal with a value equal to the first value.

16. The multistage latch-based isolation cell of claim 9, wherein the latching means comprises means for latching the first binary signal in response to reception of an enable signal with a second polarity value at the latching means.

17. The multistage latch-based isolation cell of claim 16, wherein the reset latching means comprises means for latching the second binary signal in response to reception of the delayed enable signal with the second polarity value.

18. The multistage latch-based isolation cell of claim 9, wherein the reset latching means comprises means for supplying a binary signal having a same value as the first binary signal provided to the latching means following reception of the enable signal at the latching means.

19. The multistage latch-based isolation cell of claim 9, wherein the delay means has a delay period that is greater than or equal to a period of time between reception of the enable signal at the latching means and reception of a reset signal at a module that supplies the first binary signal to the latching means.

* * * * *